(12) United States Patent
Iwanaga

(10) Patent No.: US 7,186,468 B2
(45) Date of Patent: Mar. 6, 2007

(54) ORGANIC ELECTRO-LUMINESCENT DISPLAY DEVICE AND METHOD FOR MANUFACTURING THE SAME

(75) Inventor: Hiroki Iwanaga, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 245 days.

(21) Appl. No.: 10/611,248

(22) Filed: Jul. 2, 2003

(65) Prior Publication Data
US 2004/0062950 A1    Apr. 1, 2004

(30) Foreign Application Priority Data
Sep. 30, 2002    (JP)    ............. 2002-285538

(51) Int. Cl.
*H05B 33/12*    (2006.01)
(52) U.S. Cl. ............. 428/690; 428/917; 313/504; 313/506
(58) Field of Classification Search ............. 430/319; 257/40; 313/504, 506, 505; 428/690, 917; 548/523, 557, 532; 549/68, 43, 59
See application file for complete search history.

(56) References Cited

U.S. PATENT DOCUMENTS

| 6,160,267 | A  | * | 12/2000 | Kunugi et al. ............. 257/40 |
| 6,800,379 | B2 | * | 10/2004 | Taguchi ............. 428/690 |
| 2003/0137240 | A1 | * | 7/2003 | Hartmann et al. ............. 313/504 |

FOREIGN PATENT DOCUMENTS

| JP | 10-219242 |   | 8/1998 |
| JP | 2002-158093 |   | 5/2002 |
| JP | 2003-013054 | * | 1/2003 |
| JP | 2003-267972 |   | 9/2003 |

OTHER PUBLICATIONS

Su et al., Amorphous 2, 3-substituted Thiophenes: Potential Electroluminescent Materials, Mar. 27, 2002, Chemistry of Materials, 14(4) pp. 1884-1890.*
Katsuyuki Naito et al., "Ink for Forming a Hole Injection Layer of Organic El Display Devices and Manufacturing Method Thereof, Organic El Display Devices, and Manufacturing Method of the Same", U.S. Appl. No. 10/395,253, filed Mar. 25, 2003.
Japanese Office Action, entitled "Notification of Reasons for Rejection," mailed by the Japanese Patent Office on Mar. 28, 2006 for counterpart Japanese Application No. 2002-285538.

* cited by examiner

*Primary Examiner*—Rena Dye
*Assistant Examiner*—Camie S. Thompson
(74) *Attorney, Agent, or Firm*—Finnegan, Henderson, Farabow, Garrett & Dunner, L.L.P.

(57) ABSTRACT

An organic EL display device is provided, which includes a transparent electrode, a counter electrode spaced away from the transparent electrode, a light emitting layer interposed between the transparent electrode and the counter electrode, and a hole transferring layer interposed between the transparent electrode and the light emitting layer. This hole transferring layer comprises a triaryl amine compound which can be represented by any one of general formulas (8), (9), (10) and (11) illustrated in the specification.

30 Claims, 1 Drawing Sheet

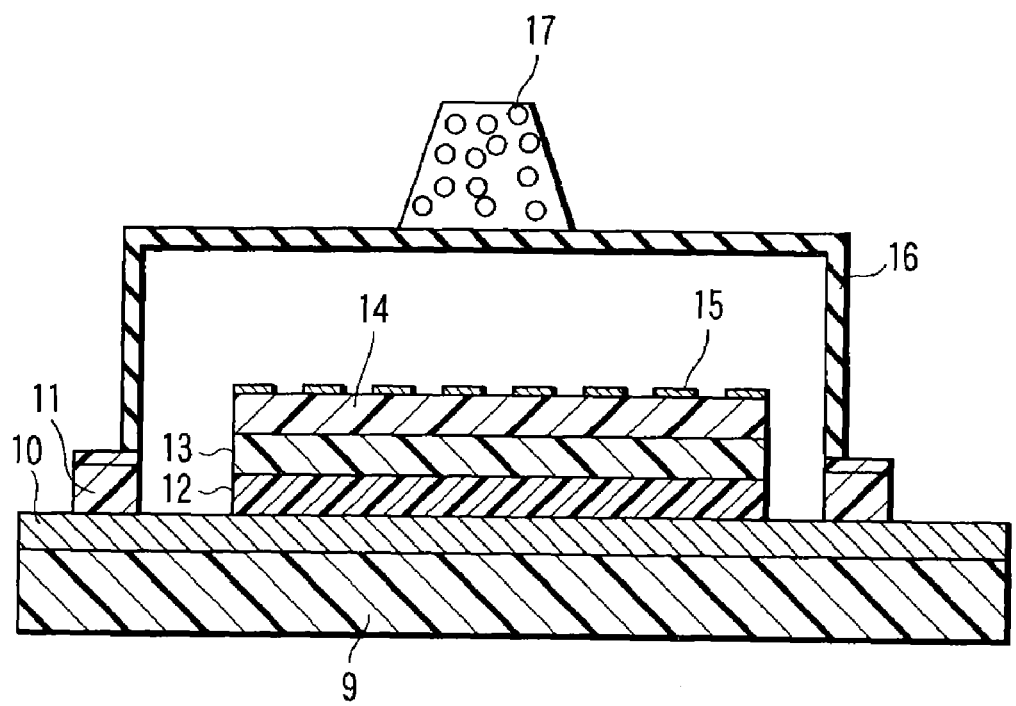
F I G. 1
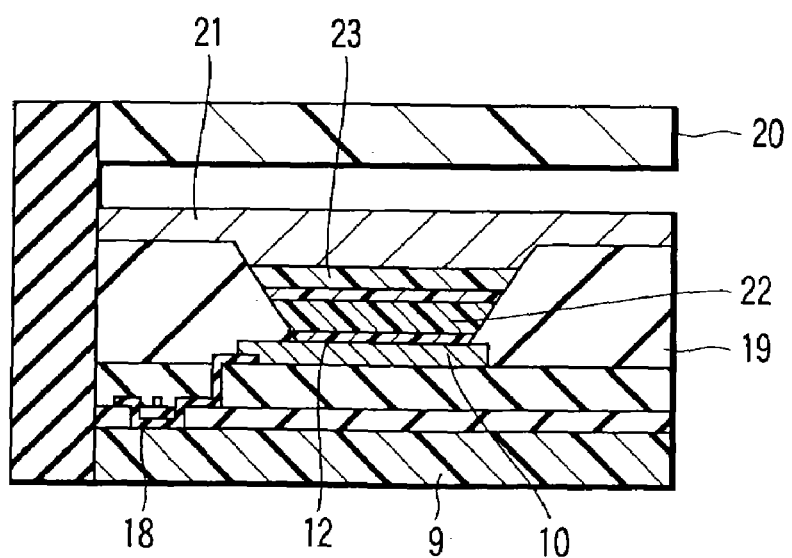
F I G. 2

ORGANIC ELECTRO-LUMINESCENT DISPLAY DEVICE AND METHOD FOR MANUFACTURING THE SAME

CROSS-REFERENCE TO RELATED APPLICATIONS

This application is based upon and claims the benefit of priority from the prior Japanese Patent Application No. 2002-285538, filed Sep. 30, 2002, the entire contents of which are incorporated herein by reference.

BACKGROUND OF THE INVENTION

1. Field of the Invention

The present invention relates to an organic electro-luminescent (EL) element, and to a method of manufacturing the organic EL element.

2. Description of the Related Art

In recent years, an electro-luminescent (EL) element formed of a multi-layer film made from an organic material is attracting much attention.

This organic EL element has been manufactured mainly by two methods, i.e., a method utilizing vacuum deposition of a low molecular material, and a method utilizing the coating of a polymer solution. According to the method utilizing the coating of a polymer solution, since it is easy to manufacture an organic EL element having a large display area, the method is suited in particular to manufacturing a full color display which is excellent in fineness and large in display area by using an ink jet process.

As for the materials for the hole-transferring layer the organic EL element, a triaryl amine-based compound has been employed as a main example of low molecular weight compounds, and also PEDOP•PSS has been employed as a main example of high molecular weight compounds. However, this triaryl amine-based compound is not capable of satisfying all of the features demanded of the organic EL element. On the other hand, the PEDOP•PSS is accompanied with the problem that since this material is of water dispersion type, it is impossible to completely eliminate water, thus unduely limiting the life of the organic EL element. These phenomena accompanied with these conventional materials will be explained in detail as follows.

Any material for the hole-transferring layer is generally demanded to have various properties such as 1) the carrier mobility thereof is large; 2) it exhibits a minimal barrier against hole injection from the electrode; 3) the glass transition point thereof is high; 4) it is highly amorphous; and 5) it is free from any moiety which may cause the generation of a photooxidative deterioration reaction.

Among these features, the aforementioned features 1) and 2) are related to the performance of the organic EL element, while the aforementioned features 3), 4) and 5) are related to the life or reliability of the organic EL element. Most important problems that have to be dealt with at present in the employment of the organic EL element are the life and reliability of the organic EL element.

It is known that as the organic EL element is actuated, the interior of the organic EL element becomes hot due to the Joule heat generated during the actuation thereof. In the process wherein this heated portion is gradually cooled, a partial crystallization of the organic component may be caused to occur, resulting in non-uniformity of the properties of the thin film thereof or resulting in damage to the flatness of the surface around the crystallized portion of the hole-transferring layer. As a result, the luminescence of the organic EL element is caused to attenuate, or caused to cease in the worst case. It is considerable, as one of the means for preventing such a problem, to enhance the glass transition temperature of the thin film. Since the mobility of molecules is minimal under temperatures below the glass transition temperature thereof, the crystallization of the thin film can hardly take place. Therefore, it is possible, through the enhancement of the glass transition temperature of the thin film up to a point higher than the maximum temperature of the organic EL element, to prevent the crystallization of the thin film.

Another means for preventing the aforementioned problem is to enhance the amorphousness of a compound. A material exhibiting a high amorphousness is incapable of easily generating the crystallization thereof even if it is heated up to the glass transition temperature or more.

However, the achievement of only one of the aforementioned features selected from high glass transition point and high amorphousness would not lead to the realization of desired properties of the organic EL element. Therefore, there have been conducted extensive searches for a compound which is capable of meeting not only the aforementioned high glass transition temperature but also the aforementioned high amorphousness.

Although the aforementioned studies have been conducted mainly on triaryl amine-based compounds up to date, no one has succeeded as yet to find a compound which is capable of satisfying all of the aforementioned desirable properties.

On the other hand, the PEDOP•PSS which can be employed in a polymer type organic EL element is a compound having a structure represented by the following chemical formula (7).

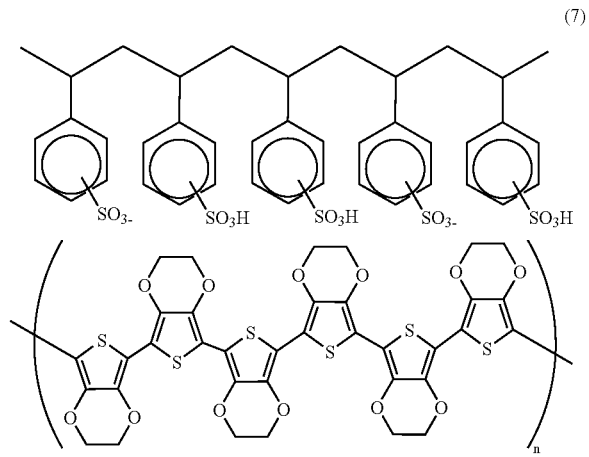

(7)

In this PEDOP•PSS, the PEDOP takes the role of the carrier transferring capability, while the PSS takes the role of stably dispersing the PEDOP•PSS in water. This PEDOP•PSS can be dispersed only in water, and hence the thin film obtained from this PEDOP•PSS cannot be dissolved by an organic solvent. Therefore, even if a luminescent layer is formed on a thin film of this PEDOP•PSS (formed as a hole transferring layer) by an ink jet, etc., using an organic EL polymer dissolved in an organic solvent, there would be little possibility of generating a mixed layer at an interface between the hole transferring layer and the luminescent layer.

However, it is very difficult to completely eliminate water from the thin film even if the thin film of PEDOP•PSS is subjected to a drying step after the coating of an aqueous dispersion of PEDOP•PSS. The water remaining inside the thin film is permitted to react with cathode, etc., thereby degrading the life of the organic EL element.

As explained above, not only in the low molecular type organic EL element, but also in the high molecular type organic EL element, no one has succeeded as yet to find out a satisfactory hole transferring material.

Further, recently, the employment of a phosphorescent compound as a luminescent layer of the organic EL element has been attracting much attention. When a hole is impinged against an electron inside the organic EL element, a singlet exciton and a triplet exciton are caused to be generated at a ratio of 1:3 in principle. A light-emitting phenomenon that will be generated as a luminous moiety returns from the singlet thereof to the ground state thereof is called fluorescence. On the other hand, a light-emitting phenomenon that will be generated as a luminous moiety returns from the triplet thereof to the ground state thereof is called phosphorescence. Judging from the ratio of excitons generated, the light take-out efficiency of the EL element would become higher when a phosphorescent compound utilizing a triplet exciton is employed as compared with the case where a fluorescent compound utilizing a singlet is employed.

However, since phosphorescence is quenched by the presence of oxygen, the degradation of the properties of the EL element that may be caused by the influences of residual water and air (oxygen) in the EL element would become more prominent as compared with the organic EL element where an ordinary fluorescent compound is employed. Further, the PEDOP•PSS that has been conventionally employed as a material for the hole transferring layer is incapable of satisfying the aforementioned conditions.

BRIEF SUMMARY OF THE INVENTION

According to one aspect of the present invention, there is provided an organic electro-luminescent display device, comprising:

a transparent electrode;

a counter electrode spaced away from the transparent electrode;

a light emitting layer interposed between the transparent electrode and the counter electrode; and a hole transferring layer interposed between the transparent electrode and the light emitting layer, the hole transferring layer comprising triaryl amine compound represented by the following general formula (1):

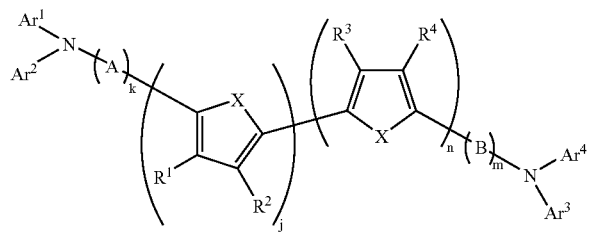

(wherein $Ar^1$, $Ar^2$, $Ar^3$ and $Ar^4$ are individually substituted or unsubstituted aryl group or aromatic heterocyclic group with proviso that a situation where a combination of groups ($Ar^1$, $Ar^2$) is identical with a combination of groups ($Ar^3$, $Ar^4$) is excluded; A and B may be the same with or different from each other and are individually substituted or unsubstituted aryl group or aromatic heterocyclic group; k and m are respectively an integer; X is a heteroatom; j is an integer of 1 or more; n is an integer of 1 or more; $R^1$, $R^2$, $R^3$ and $R^4$ may be the same with or different from each other and are individually hydrogen atom, straight or branched substituted or unsubstituted alkyl group, alkoxy group or aryl group wherein the alkyl groups or alkoxy groups which are bonded to neighboring carbon atom may be connected together to form a closed ring.)

According to another aspect of the present invention, there is provided an organic electro-luminescent display device, comprising:

a transparent electrode;

a counter electrode spaced away from the transparent electrode;

a light emitting layer interposed between the transparent electrode and the counter electrode; and a hole transferring layer interposed between the transparent electrode and the light emitting layer, the hole transferring layer comprising triaryl amine compound represented by the following general formula (3):

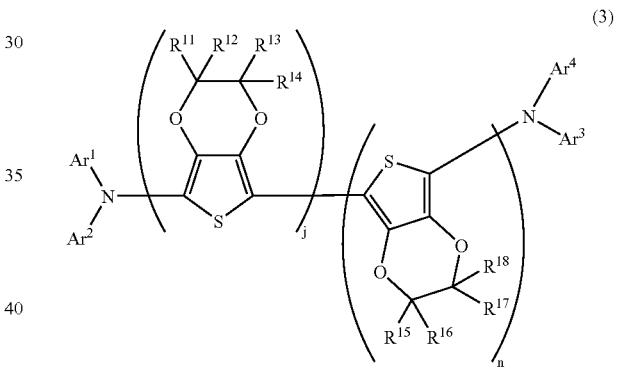

(wherein $Ar^1$, $Ar^2$, $Ar^3$ and $Ar^4$ may be the same with or different from each other and are individually substituted or unsubstituted aryl group or aromatic heterocyclic group with proviso that a situation where a combination of groups ($Ar^1$, $Ar^2$) is identical with a combination of groups ($Ar^3$, $Ar^4$) is excluded; $R^{11}$, $R^{12}$, $R^{13}$, $R^{14}$, $R^{15}$, $R^{16}$, $R^{17}$ and $R^{18}$ may be the same with or different from each other and are individually hydrogen atom, straight or branched substituted or unsubstituted alkyl group, alkoxy group or aryl group; j is an integer of 1 or more; and n is an integer of 1 or more.)

According to a another aspect of the present invention, there is provided an organic electro-luminescent display device, comprising:

a transparent electrode;

a counter electrode spaced away from the transparent electrode;

a light emitting layer interposed between the transparent electrode and the counter electrode; and a hole transferring layer interposed between the transparent electrode and the light emitting layer, the hole transferring layer comprising triaryl amine compound represented by the following general formula (5):

(5)

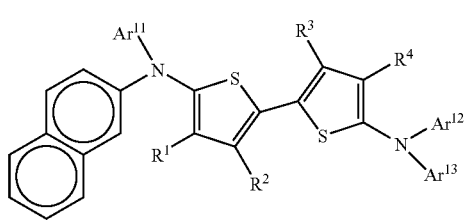

(1)

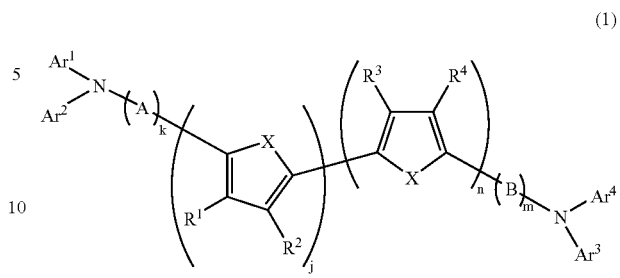

(wherein $Ar^{11}$ is substituted or unsubstituted phenyl group, naphthyl group, tetrahydronaphthyl group or heterocyclic group constituted by a single ring; $Ar^{12}$ and $Ar^{13}$ may be the same with or different from each other and are individually substituted or unsubstituted phenyl group or heterocyclic group constituted by a single ring; and $R^1$, $R^2$, $R^3$ and $R^4$ may be the same with or different from each other and are individually hydrogen atom, straight or branched substituted or unsubstituted alkyl group, alkoxy group or aryl group wherein the alkyl groups or alkoxy groups which are bonded to neighboring carbon atom may be connected together to form a closed ring.)

According to a another aspect of the present invention, there is provided an organic electro-luminescent display device, comprising:

a transparent electrode;

a counter electrode spaced away from the transparent electrode;

a light emitting layer interposed between the transparent electrode and the counter electrode; and a hole transferring layer interposed between the transparent electrode and the light emitting layer, the hole transferring layer comprising triaryl amine compound represented by the following general formula (6):

(6)

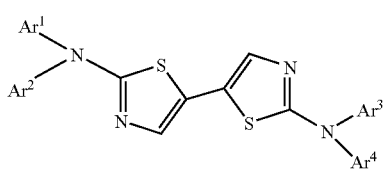

(wherein $Ar^1$, $Ar^2$, $Ar^3$ and $Ar^4$ are individually substituted or unsubstituted aryl group or aromatic heterocyclic group with proviso that a situation where a combination of groups ($Ar^1$, $Ar^2$) is identical with a combination of groups ($Ar^3$, $Ar^4$) is excluded.)

According to a further aspect of the present invention, there is provided a method of manufacturing the organic electro-luminescent display device of one aspect of the present invention, the method comprising:

forming a transparent electrode on a substrate;

forming a hole transferring layer on the transparent electrode, the hole transferring layer comprising triaryl amine compound represented by the following general formula (1);

forming a light emitting layer on the hole transferring layer; and forming a counter electrode above the light emitting layer;

wherein at least one of the hole transferring layer and the light emitting layer is patterned by photolithography.

(wherein $Ar^1$, $Ar^2$, $Ar^3$ and $Ar^4$ are individually substituted or unsubstituted aryl group or aromatic heterocyclic group with proviso that a situation where a combination of groups ($Ar^1$, $Ar^2$) is identical with a combination of groups ($Ar^3$, $Ar^4$) is excluded; A and B may be the same with or different from each other and are individually substituted or unsubstituted aryl group or aromatic heterocyclic group; k and m are respectively an integer; X is a heteroatom; j is an integer of 1 or more; n is an integer of 1 or more; $R^1$, $R^2$, $R^3$ and $R^4$ may be the same with or different from each other and are individually hydrogen atom, straight or branched substituted or unsubstituted alkyl group, alkoxy group or aryl group wherein the alkyl groups or alkoxy groups which are bonded to neighboring carbon atom may be connected together to form a closed ring.)

According to a further aspect of the present invention, there is provided a method of manufacturing the organic electro-luminescent display device of another aspect of the present invention, the method comprising:

forming a transparent electrode on a substrate;

forming a hole transferring layer on the transparent electrode, the hole transferring layer comprising triaryl amine compound represented by the following general formula (3);

forming a light emitting layer on the hole transferring layer; and forming a counter electrode above the light emitting layer;

wherein at least one of the hole transferring layer and the light emitting layer is patterned by photolithography.

(3)

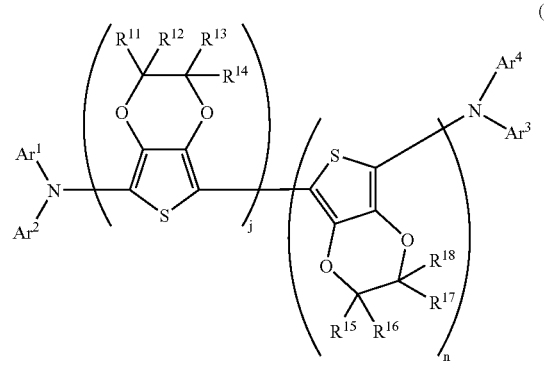

(wherein $Ar^1$, $Ar^2$, $Ar^3$ and $Ar^4$ may be the same with or different from each other and are individually substituted or unsubstituted aryl group or aromatic heterocyclic group with proviso that a situation where a combination of groups ($A^1Ar^2$) is identical with a combination of groups ($Ar^3$, $Ar^4$) is excluded; $R^{11}$, $R^{12}$, $R^{13}$, $R^{14}$, $R^{15}$, $R^{16}$, $R^{17}$ and $R^{18}$ may be the same with or different from each other and are individually hydrogen atom, straight or branched substituted or unsubstituted alkyl group, alkoxy group or aryl group; j is an integer of 1 or more; and n is an integer of 1 or more.)

According to a further aspect of the present invention, there is provided a method of manufacturing the organic electro-luminescent display device of another aspect of the present invention, the method comprising:

forming a transparent electrode on a substrate;

forming a hole transferring layer on the transparent electrode, the hole transferring layer comprising triaryl amine compound represented by the following general formula (5);

forming a light emitting layer on the hole transferring layer; and forming a counter electrode above the light emitting layer;

wherein at least one of the hole transferring layer and the light emitting layer is patterned by photolithography.

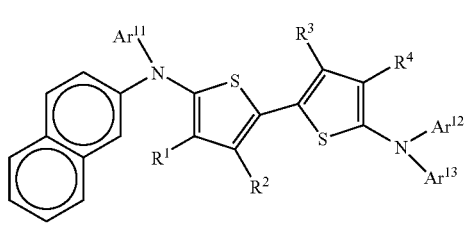

(5)

(wherein $Ar^{11}$ is substituted or unsubstituted phenyl group, naphthyl group, tetrahydronaphthyl group or heterocyclic group constituted by a single ring; $Ar^{12}$ and $Ar^{13}$ may be the same with or different from each other and are individually substituted or unsubstituted phenyl group or heterocyclic group constituted by a single ring; and $R^1$, $R^2$, $R^3$ and $R^4$ may be the same with or different from each other and are individually hydrogen atom, straight or branched substituted or unsubstituted alkyl group, alkoxy group or aryl group wherein the alkyl groups or alkoxy groups which are bonded to neighboring carbon atom may be connected together to form a closed ring.)

According to a further aspect of the present invention, there is provided a method of manufacturing the organic electro-luminescent display device of another aspect of the present invention, the method comprising:

forming a transparent electrode on a substrate;

forming a hole transferring layer on the transparent electrode, the hole transferring layer comprising triaryl amine compound represented by the following general formula (6);

forming a light emitting layer on the hole transferring layer; and forming a counter electrode above the light emitting layer;

wherein at least one of the hole transferring layer and the light emitting layer is patterned by photolithography.

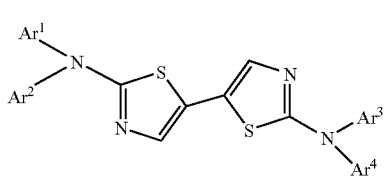

(6)

(wherein $Ar^1$, $Ar^2$, $Ar^3$ and $Ar^4$ are individually substituted or unsubstituted aryl group or aromatic heterocyclic group with proviso that a situation where a combination of groups ($Ar^1$, $Ar^2$) is identical with a combination of groups ($Ar^3$, $Ar^4$) is excluded.)

BRIEF DESCRIPTION OF THE SEVERAL VIEWS OF THE DRAWING

FIG. 1 is a cross-sectional view schematically illustrating the structure of a low molecular type organic electro-luminescent display device according to one embodiment of the present invention; and FIG. 2 is a cross-sectional view schematically illustrating the structure of a high molecular type organic electro-luminescent display device according to one embodiment of the present invention.

DETAILED DESCRIPTION OF THE INVENTION

The present inventors have found out that a compound having a couple of asymmetrical triaryl amine moieties which are linked to each other by a heterocycle is capable of exhibiting not only high amorphousness but also high glass transition point. Furthermore, it has been also found out by the present inventors that when the aforementioned compound is employed as a material for a hole transferring layer, it is possible to improve the life and reliability of an organic EL display device, thus accomplishing the present invention.

As for the aryl group that can be introduced as $Ar^1$, $Ar^2$, $Ar^3$ and $Ar^4$ into the aforementioned general formula (1), it is possible to employ phenyl group, biphenyl group, naphthyl group, fluorene skeleton and fluorenone skeleton. Further, as for the aromatic heterocyclic group, it is possible to employ thiophene ring, selenophene ring and pyrrole ring for instance. Any of hydrogen atoms included in these aryl groups and aromatic heterocyclic group may be substituted by an alkyl group, an alkoxy group, a fused ring constituted by neighboring substituent groups forming this cyclic structure, or a halogen atom.

Incidentally, when a couple of right and left triaryl amine moieties in the compound represented by the aforementioned general formula (1) are different in molecular structure, the effect of high amorphousness due to this asymmetry in molecular structure will be more prominently manifested. Therefore, such a molecular structure where a combination of groups ($Ar^1$, $Ar^2$) is identical with a combination of groups ($Ar^3$, $Ar^4$) is undesirable and hence should be excluded from the scope of the present invention. When all of $Ar^1$, $Ar^2$, $Ar^3$ and $Ar^4$ are constituted by different molecular structures from each other, this high amorphousness would become more prominent and hence such a structure is more desirable.

It is desirable, in order to enhance the glass transition point of a compound, to introduce a rigid substituent group such as aryl group (such as naphthyl group) or aromatic heterocyclic group (such as oligothiophene ring) into at least one of groups ($Ar^1$, $Ar^2$) or into at least one of groups ($Ar^3$, $Ar^4$). If the aforementioned high amorphousness is to be retained, the rigid group mentioned above should preferably be introduced into only one of the triaryl amine moieties, i.e. either the right triaryl amine or the left triaryl amine.

The aforementioned aryl group and aromatic heterocyclic group can be introduced, as A and B, introduced in the aforementioned general formula (1). The symbols k and m in this general formula (1) are respectively an integer, and hence if all of these k and m are zero, the vapor deposition performance of the compound would be enhanced on the occasion of fabricating the EL display device. On the other hand, if any one of these k and m is permitted to exist, it would be advantageous in enhancing the amorphousness of the molecule.

A linkage portion between a couple of triaryl amine moieties should preferably be constructed such that the torsion angle between the aromatic rings is large. Namely, when the torsion angle between these right and left triaryl amine moieties is large, the flatness of the molecule would be deteriorated as a whole, thereby making it possible to enhance the amorphousness owing to the effect of this asymmetric structure. On the other hand, if this couple of triaryl amine moieties are identical in structure with each other, it would be impossible to derive the effect of this torsion angle, thus failing to secure the aforementioned high amorphousness and hence considerably deteriorating the characteristics of the molecule.

In order to realize the aforementioned high amorphousness derived from the torsion of the ring, the number of hetero ring at the linkage portion is required to be at least two.

As for the alkyl groups to be introduced as $R^1$, $R^2$, $R^3$ and $R^{44}$ into the hetero ring in the aforementioned general formula (1), it is possible to employ, for example, a linear structure thereof such as methyl group, ethyl group, propyl group, butyl group, pentyl group, hexyl group, heptyl group, octyl group, etc. and a branched structure thereof. Neighboring alkyl groups may be connected with each other to form a ring. Further, as for alkoxy group, it is possible to employ, for example, a group having oxygen atom introduced into a bonding portion of any one of the aforementioned alkyl groups. As for aryl group, it is possible, for example, phenyl group, biphenyl group, naphthyl group and aromatic heterocycle. Any of hydrogen atoms included in these alkyl group, alkoxy groups, and aryl group may be substituted for example by deuterium atom, fluorine atom, chlorine atom, etc.

As for the heteroatom X, it is possible to employ, for example, S, Se, Si, Ge, O and N. Because of richness in electron and excellence in stability, the employment of S is preferable in particular.

As described above, n is an integer of 1 or more, and there is not any particular limitation with regard to the upper limit thereof. And j is an integer of 1 or more, and there is not any particular limitation with regard to the upper limit thereof. However, in view of the vapor deposition capability of the compound when it is employed for the fabrication of a low molecular type organic EL display device, the upper limit of (n+j) should preferably be within about 10.

To further enhance the amorphousness of molecule, the introduction of a polar group into a specific site of the molecule would be effective. In particular, the introduction of fluorine atom or a substituent group containing fluorine atom to a specific site of the molecule would be effective. It has been found, as a result of intensive studies made by the present inventors, that when fluorine atom or a substituent group containing fluorine atom is introduced into only one of the aryl amine moieties in the aforementioned general formula (1), it is possible to improve the amorphousness of the thin film. Specifically, it is preferable to employ a compound represented by said general formula (1) wherein at least one of ($Ar^1$, $Ar^2$) contains fluorine atom, and none of ($Ar^3$, $Ar^4$) include fluorine atom, or a compound represented by said general formula (1) wherein at least one of ($Ar^3$, $Ar^4$) contains fluorine atom, and none of ($Ar^1$, $Ar^2$) contain fluorine atom. Fluorine atom may be introduced into the aforementioned compound by directly substituting fluorine atom for any one of hydrogen atoms included in $Ar^1$, $Ar^2$, $Ar^3$ or $Ar^4$. Alternatively, fluorine atom may be introduced into the aforementioned compound by substituting a substituent group containing fluorine atom for any one of hydrogen atoms included in $Ar^1$, $Ar^2$, $Ar^3$ or $Ar^4$. As for the substituent group containing fluorine atom, it is possible to employ, for example, alkyl group containing therein fluorine atom or alkoxy group containing therein fluorine atom, examples of which including perfluoroalkyl group ($C_nF_{2n+1}$) such as trifluoromethyl group ($CF_3$), $C_2F_5$, $C_3F_7$, $C_4F_9$, etc.; perfluoroalkoxy group such as $OCF_3$, $OC_2F_5$, $OC_3F_7$, etc.; $-(CH_2)_n(CF_2)_mCF_3$ and $-O(CH_2)_n(CF_2)_mCF_3$ (wherein n and m are respectively an integer of 1 or more).

More preferable examples of the triaryl amine compound represented by the aforementioned general formula (1) are those having a structure represented by the following general formula (2):

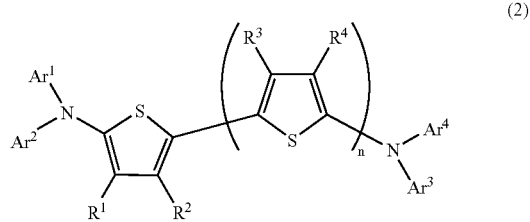

(wherein $Ar^1$, $Ar^2$, $Ar^3$ and $Ar^4$ are individually substituted or unsubstituted aryl group or aromatic heterocyclic group with proviso that a situation where a combination of groups ($Ar^1$, $Ar^2$) is identical with a combination of groups ($Ar^3$, $Ar^4$) is excluded; $R^1$, $R^2$, $R^3$ and $R^4$ may be the same with or different from each other and are individually hydrogen atom, straight or branched substituted or unsubstituted alkyl group, alkoxy group or aryl group wherein the alkyl groups or alkoxy groups which are bonded to neighboring carbon atom may be connected together to form a closed ring; and n is an integer of 1 or more.)

In the aforementioned general formula (2), a couple of right and left triaryl amine moieties are linked together by oligothiophene. Although this oligothiophene is linear in structure, the torsion angle between these rings is relatively large, thereby making it possible to enhance the asymmetry of the molecule as a whole as a large substituent group is bonded to both ends of the molecule.

Next, the asymmetry of the molecule will be explained with reference to a more specific compound. The following general formula (4) denotes one example of the compound represented by the aforementioned general formula (2)

wherein $Ar^1$, $Ar^3$ and $Ar^4$ are respectively constituted by phenyl group; $Ar^2$ is constituted by naphthyl group; and n is 1.

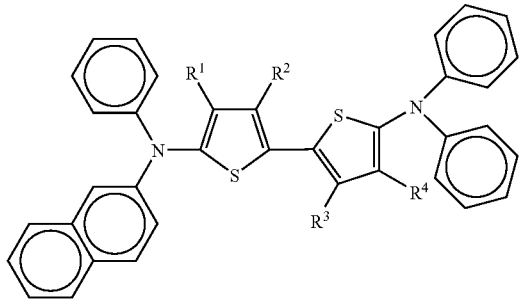

(4)

Since naphthyl group is introduced into only one of the triaryl amine moieties, it is possible to secure desirable characteristics such as high glass transition point and high amorphousness. Moreover, since the linking portion between a couple of triaryl amine moieties is constituted by thiophene, the asymmetry of the molecule can be enhanced as explained above.

The compound represented by the aforementioned general formula (4) can be represented by the following general formula (5):

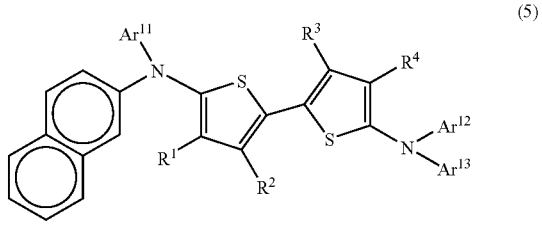

(5)

In this general formula (5), $Ar^{11}$ is substituted or unsubstituted phenyl group, naphthyl group, tetrahydronaphthyl group or heterocyclic group constituted by a single ring; $Ar^{12}$ and $Ar^{13}$ may the same with or different from each other and are individually substituted or unsubstituted phenyl group or heterocyclic group constituted by a single ring; and $R^1$, $R^2$, $R^3$ and $R^4$ are the same with those illustrated with reference to the aforementioned general formula (1).

As already explained above, when a compound represented by the general formula (5) is formulated such that at least one of ($Ar^{12}$, $Ar^{13}$) contains fluorine atom, and that none of ($Ar^{11}$, biphenyl) include fluorine atom, or when a compound represented by the general formula (5) is formulated such that at least one of ($Ar^{11}$, biphenyl) contains fluorine atom, and that none of ($Ar^{12}$, $Ar^{13}$) contain fluorine atom, the amorphousness of the compound can be preferably enhanced.

The hole transferring layer of organic EL display device according to another embodiment of the present invention comprises a compound represented by the following general formula (3):

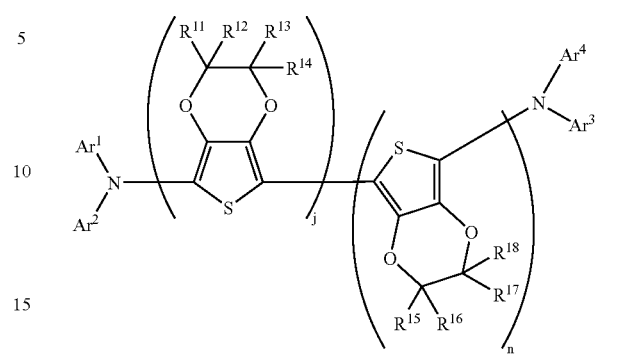

(3)

As already explained with reference to the general formula (1), substituted or unsubstituted aryl group as well as substituted or unsubstituted aromatic heterocyclic group can be also introduced as $Ar^1$, $Ar^2$, $Ar^3$ and $Ar^4$ into the compound represented by the following general formula (3).

When a compound represented by the general formula (3) is formulated such that at least one of ($Ar^1$, $Ar^2$) contains fluorine atom, and that none of ($Ar^3$, $Ar^4$) include fluorine atom, or when a compound represented by the general formula (3) is formulated such that at least one of ($Ar^3$, $Ar^4$) contains fluorine atom, and that none of ($Ar^1$, $Ar^2$) contain fluorine atom, the amorphousness of the compound can be preferably enhanced.

As for the specific examples of alkyl group, alkoxy group and aryl group which can be introduced as $R^{11}$, $R^{12}$, $R^{13}$, $R^{14}$, $R^{15}$, $R^{16}$, $R^{17}$ and $R^{18}$ into the compound represented by the following general formula (3), it is possible to employ the same kinds groups as already explained above. In order to realize high amorphousness of the compound through the enhancement of asymmetry of molecule, the groups to be introduced into these Rs should preferably be different from each other.

Further, because of the same reason, the upper limit of n should preferably be within about 10.

As shown in the aforementioned general formula (3), the hole transferring capability thereof can be further enhanced by the cyclization of the substituent groups of oligothiophene constituting the linking portion of the compound.

The hole transferring layer of organic EL display device according to a further embodiment of the present invention comprises a compound represented by the following general formula (6):

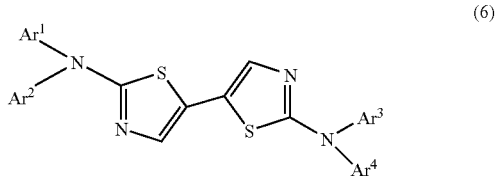

(6)

As for the groups to be introduced into $Ar^1$, $Ar^2$, $Ar^3$ and $Ar^4$ in this general formula (6), it is possible to employ the same kinds of groups as already explained with reference to the general formula (1).

When a compound represented by the general formula (6) is formulated such that at least one of ($Ar^1$, $Ar^2$) contains fluorine atom, and that none of (Ar³, Ar⁴) include fluorine atom, or when a compound represented by the general formula (6) is formulated such that at least one of (Ar³, Ar⁴) contains fluorine atom, and that none of (Ar¹, Ar²) contain fluorine atom, the amorphousness of the compound can be preferably enhanced.

In this compound represented by the general formula (6), two kinds of heteroatoms, i.e. sulfur atom and nitrogen atom are introduced into specific sites of the hetero ring linking a couple of triaryl amine moieties. As a result, it is possible to further enhance the amorphousness of the compound.

The compounds described above can be suitably employed as a material for the hole transferring layer of the low molecule type organic electro-luminescent display device. One example of this low molecule type organic electro-luminescent display device is illustrated in FIG. 1.

In this organic electro-luminescent display device shown in FIG. 1, a laminate structure comprising a hole transferring layer 12, a light emitting layer 13, an electron transferring layer 14 and a counter electrode (metal electrode) 15 is disposed on the surface of a glass substrate 9 having thereon a transparent electrode (anode) 10 formed of ITO for instance. The hole transferring layer 12 may be a laminated layer comprising a buffer layer containing phthalocyanine. A laminate including an electron injection layer or an anode buffer layer between the light emitting layer 13 and the transparent electrode. The counter electrode may be constituted by Al for instance, and an MgF₂ buffer layer (not shown) may be disposed below this counter electrode. This laminate structure can be sealed by a sealing cap 16 wherein a sealing portion 11 is provided at an end portion of this sealing cap 16. Furthermore, a desiccating agent is disposed on the top of this sealing cap 16.

As for the materials for manufacturing the hole transferring layer 12 of the organic electro-luminescent display device constructed in this manner, the compounds as already explained above can be suitably employed.

When these compounds are polymerized or cross-linked, they can be employed for manufacturing the hole transferring layer of a high molecular type organic electro-luminescent display device. One example of such a high molecular type organic EL display device is illustrated in FIG. 2.

In this high molecular type organic electro-luminescent display device shown in FIG. 2, a laminate structure comprising a transparent electrode (anode) 10 formed of ITO for instance, a hole transferring layer 12, a polymeric light emitting layer 22, and a buffer layer 23 is disposed on the surface of a glass substrate 9 which is provided with a transistor 18. This laminate structure is isolated by a barrier 19, and a counter electrode (silver electrode) 21 is deposited all over the surface. Furthermore, a sealing film 20 is disposed thereover.

The polymerization of the compounds represented by the aforementioned general formulas (1), (2) and (3) can be performed by the reaction thereof with cinnamaldehyde or a derivative thereof for instance. As shown in the following reaction formula (1), first of all, when two or more aryl groups of the aryl amine are phenyl groups, the aldehyde group of cinnamaldehyde reacts with the phenyl group. The reactivity of this phenyl group is of ortho-para orientation. Since the ortho position suffers from steric hindrance, the reactivity of the phenyl group will be deteriorated so that as a matter of fact, the reaction selectively proceeds only at the para position, thereby generating a polymer of low molecular weight.

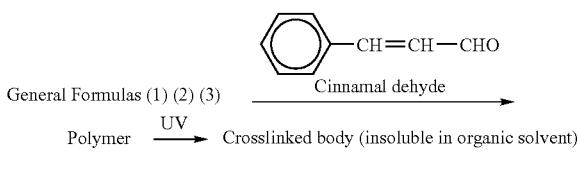

Reaction Formula (1)

General Formulas (1) (2) (3) + Cinnamal dehyde

Polymer →UV→ Crosslinked body (insoluble in organic solvent)

The polymer obtained from this reaction is soluble in some kinds of organic solvent, and contains therein a linkage which is still unsaturated. Then, a thin film containing this polymer is formed, and the unsaturated linkage is polymerized by UV irradiation, thereby obtaining a crosslinking structure. As a result, a polymeric thin film insoluble to organic solvents can be formed.

After this polymeric thin film which is insoluble to organic solvents is formed as a hole transferring layer 12, a solution containing an organic EL polymer dissolved therein is formed into a film by an ink jet to form a polymeric light emitting layer 22. In this case, since the crosslinked body constituting the hole transferring layer 12 is insoluble to organic solvents, there is little possibility of generating a mixed layer between the hole transferring layer and the polymeric light emitting layer. Moreover, since the employment of water is not required in this case in contrast to the conventional PEDOT•PSS, the life of the display device can be considerably enhanced in terms of waterproofing. Namely, the hole transferring layer can be formed by a non-aqueous process.

Further, by using this method, the hole transferring layer can be patterned by photolithography. Specifically, the polymer obtained from the aforementioned reaction formula (1) is dissolved in a solvent such as toluene, anisole, tetralin or a derivative thereof to prepare a solution. Then, by suitable method such as spin coating, this solution is coated on the surface of a predetermined substrate to form a film. Further, by using a mask, only the pixel region is subjected to a patterning irradiation of ultraviolet rays, thereby selectively crosslinking on the film of the exposure region (pixel region). The exposure dose of ultraviolet rays on this occasion may be in the range of 10 to 200 mJ/cm² for example. If this exposure dose is less than 10 mJ/cm², it would be difficult to sufficiently crosslink the exposure region. On the other hand, if this exposure dose is larger than 200 mJ/cm², part of the polymer would be deteriorated photochemically, thereby giving rise to the attenuation in intensity of light emission. Finally, the film is subjected to development using an organic solvent such as toluene to dissolve and remove the film located at the non-exposure region, thus making it possible to selectively form the hole transferring layer only within the regions of pixel. For example, this development may be performed, after the patterning irradiation of the film, by immersing the film in an organic solvent for a period ranging from 1 to 10 minutes. As for the organic solvent employed in this case, it is possible to employ, for example, hexane, xylene or alcohols such as methanol.

It is possible, in this method, to perform the aforementioned patterning by using photolithography instead of employing the ink jet method. When an organic EL display device having a large display area is formed by the ink jet method, it would take a long period of time. Furthermore, the ink employed in the execution of the ink jet method is required to meet a number of specific conditions, thus restricting the manufacture of the organic EL display device.

Whereas when the photolithography is employed for the execution of aforementioned patterning, these inconveniences involved in the ink jet method can be overcome.

The aforementioned method of performing the patterning of the hole transferring layer of the organic EL display device is also applicable to the formation of a light emitting layer. In the case, a compound represented by the following chemical formula (P2) can be employed as a light emitting material:

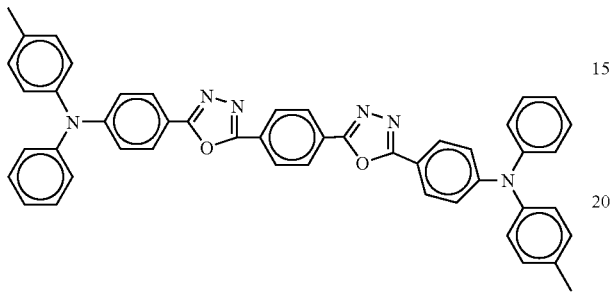

(P2)

Namely, first of all, this compound is allowed to react with cinnamaldehyde to prepare a linear polymer which is soluble in an organic solvent. Then, a solution of this polymer is coated on the surface of a predetermined substrate to form a film, which is then subjected to a patterning irradiation by using UV, thus making it possible to form a light emitting layer by photolithography.

The light emitting layer formed on the hole transferring layer obtained by the aforementioned non-aqueous process should preferably be constituted by a phosphorescent compound containing a metal complex. A metal complex is accompanied with a problem that the ligand thereof will be eliminated as it is contacted with water, especially when it is contacted with strong acid or strong base (ligand exchange), resulting in a prominent decrease in luminescence intensity. Conventionally, PEDOP•PSS has been employed as a material for the hole transferring layer. Since this PEDOP•PSS is hydrophilic, it is impossible to completely remove water therefrom. Moreover, since this PEDOP•PSS is highly acidic, when a light emitting layer constituted by a phosphorescent compound is formed on the hole transferring layer made of this PEDOP•PSS, the life of the light emitting layer would be extremely shortened. In spite of the advantages of the phosphorescent compound that it is excellent in emission efficiency and quite suited for use in a high-efficiency organic EL display device, it has been considered difficult to actually employ the phosphorescent compound because of the aforementioned reasons.

Whereas, when a method employing a non-aqueous process or a photolithography process is employed, it is free from any residual water as well as from the problem of acidity. As a result, it is possible to manufacture an organic EL display device excellent in the luminescent take-out efficiency and long in life.

As for the specific examples of this phosphorescent compound for forming the light emitting layer, it is preferable to employ an iridium complex because of the facts that the iridium complex is excellent in quantum efficiency and relatively high in stability.

As for specific examples of this iridium complex, it is possible to employ the following compounds represented by the following chemical formula (13).

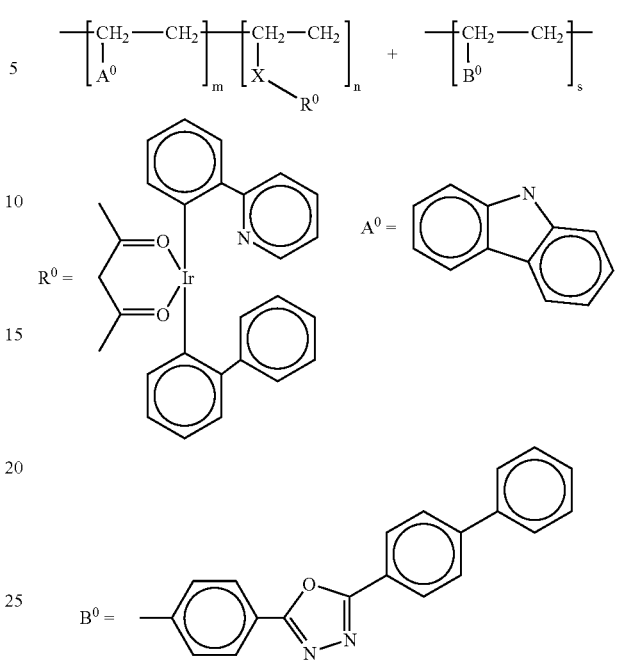

(13)

wherein m, n and s are respectively an integer of 1 or more.

Alternatively, a complex of rare earth elements such as europium, terbium, gadolinium, etc. can be also employed as a phosphorescent compound.

Next, the present invention will be further explained in detail with reference to the following embodiments. However, these embodiments are not intended to limit the scope of the present invention.

Compounds represented by the following chemical formulas (8), (9), (10) and (11) were prepared as a hole transferring layer.

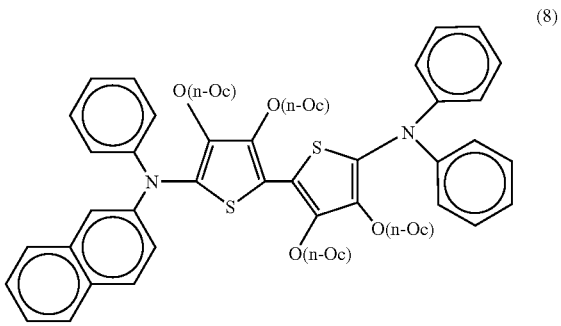

(8)

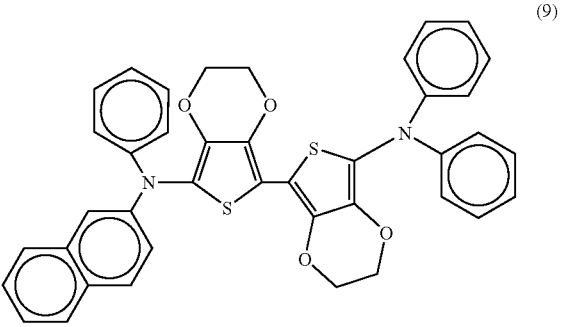

(9)

-continued

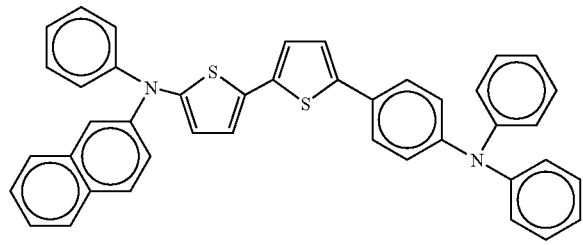

(10)

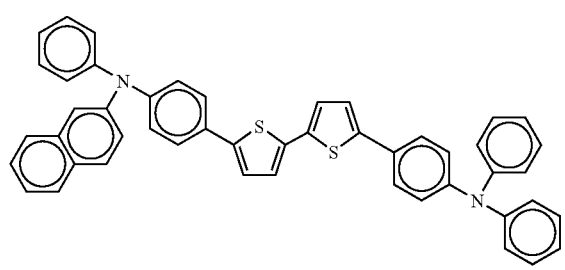

(11)

These compounds were synthesized according to the following procedures. Namely, first of all, thiophene dihalide polymer and triaryl amine halide were cross-coupled in the presence of a Ni catalyst. On this occasion, two kinds of triaryl amine were concurrently reacted-with one kind of thiophene dihalide polymer to produce four kinds of compounds, which were separated by using liquid chromatography (HPLC), thus obtaining each of these compounds.

EXAMPLE 1

A material represented by the aforementioned chemical formula (8) for forming a hole transferring layer was vapor-deposited on the surface of an ITO-attached substrate to form the hole transferring layer, thus preparing a low molecular type organic EL display device having a structure as shown in FIG. 1. More specifically, an ITO (indium-tin-oxide) film having a thickness of 100 nm was formed as a transparent electrode (anode) 10 on the surface of a glass substrate 9. Then, a compound represented by the aforementioned chemical formula (8) was vapor-deposited on the transparent electrode 10 to form a hole transferring layer 12 having a thickness of 60 nm.

$Alq_3$ (tris(8-quinolilato)aluminum) was employed as a material for the light emitting layer 13 and vapor-deposited on the hole transferring layer 12 to form the light emitting layer 13. An $MgF_2$ buffer layer having a thickness of about 10 nm was deposited over the light emitting layer 13, and then, an Al film having a thickness of about 200 nm was deposited thereon as a counter electrode (cathode).

The resultant structure was covered with a sealing cap 16 made of a fluororesin to fabricate a sealed portion 11, on which silica gel was disposed as a desiccating agent 17, thus manufacturing a low molecular type organic EL display device as shown in FIG. 1.

The EL display device thus obtained was subjected to a continuously actuation for ten thousand hours while applying a voltage of 15V thereto. As a result, the deterioration in luminance thereof was confined within 30%, and any pixel which ceased to emit any longer was not recognized at all.

EXAMPLE 2

The same procedures as explained in Example 1 were repeated except that as a material for the hole transferring layer, a compound represented by the aforementioned chemical formula (9) was substituted for the compound employed in Example 1 as a material for the hole transferring layer, thereby manufacturing a low molecular type organic EL display device as shown in FIG. 1.

The EL display device thus obtained was subjected to a continuously actuation for ten thousand hours in the same manner as conducted in Example 1. As a result, the luminance thereof after this experiment was found 80% relative to the initial value of luminance, and any pixel which ceased to emit any longer was not recognized at all.

EXAMPLE 3

The same procedures as explained in Example 1 were repeated except that as a material for the hole transferring layer, a compound represented by the aforementioned chemical formula (10) was substituted for the compound employed in Example 1 as a material for the hole transferring layer, thereby manufacturing a low molecular type organic EL display device as shown in FIG. 1.

The EL display device thus obtained was subjected to a continuously actuation for ten thousand hours in the same manner as conducted in Example 1. As a result, the deterioration in luminance thereof was confined within 20%, and any pixel which ceased to emit any longer was not recognized at all. Since the compound employed in this example was especially large in asymmetry of the molecular structure thereof, it was considered possible to prevent the generation of defects such as partial crystallization.

EXAMPLE 4

The same procedures as explained in Example 1 were repeated except that as a material for the hole transferring layer, a compound represented by the aforementioned chemical formula (11) was substituted for the compound employed in Example 1 as a material for the hole transferring layer, thereby manufacturing a low molecular type organic EL display device as shown in FIG. 1.

The EL display device thus obtained was subjected to a continuously actuation for ten thousand hours in the same manner as conducted in Example 1. As a result, the deterioration in luminance thereof was confined within 30%, and any pixel which ceased to emit any longer was not recognized at all.

Comparative Example 1

The same procedures as explained in Example 1 were repeated except that as a material for the hole transferring layer, a compound represented by the following chemical formula (12) was substituted for the compound employed in Example 1 as a material for the hole transferring layer, thereby manufacturing a low molecular type organic EL display device as shown in FIG. 1.

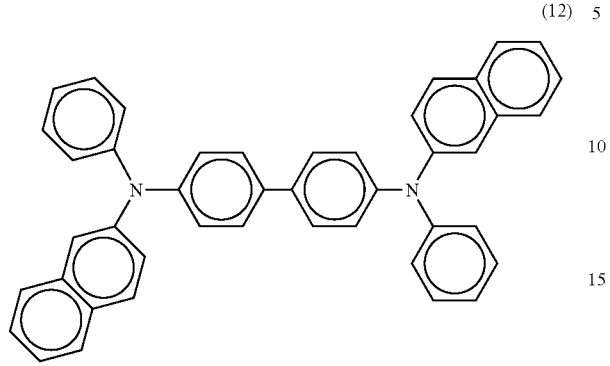

(12)

The EL display device thus obtained was subjected to a continuously actuation for ten thousand hours in the same manner as conducted in Example 1. As a result, the luminance thereof after this experiment was found about 40% relative to the initial value of luminance. Further, the number of the pixels which ceased to emit was generated at a ratio of 300 or more per 10,000 of pixels. The compound employed in this comparative example was constructed such that as shown in the chemical formula (12), the molecular structure of a couple of triaryl amine moieties was the same with each other, and moreover, they were not linked through a heterocycle. Therefore, it was assumed that the amorphousness of the compound was minimal and the glass transition temperature thereof was also low.

EXAMPLE 5

A material represented by the aforementioned chemical formula (8) for forming a hole transferring layer was mixed with a material represented by the aforementioned chemical formula (9) for forming a hole transferring layer to obtain a mixture (1:1 in molar ratio), which was then allowed to react with cinnamaldehyde to synthesize a polymer. The polymer obtained in this manner was then dissolved in toluene to obtain a toluene solution, which was employed for forming the hole transferring layer 12, thus preparing an organic EL display device having a structure as shown in FIG. 2.

More specifically, a TFT 18 was formed according to the ordinary process on the surface of a glass substrate 9, and then, an ITO (indium-tin-oxide) film having a thickness of 100 nm was formed as. a transparent electrode (anode) 10 on the resultant surface of the glass substrate 9. Then, by using a photoresist process, barriers 19 were formed in a lattice pattern. The formation of the hole transferring layer 12 was performed in such a manner that by an ink jet method, the aforementioned toluene solution was coated into a pattern of organic EL pixels and then allowed to dry under heating. Then, the resultant patterned thin film was irradiated with a xenon lamp to polymerize and crosslink it, thus obtaining a hole transferring layer 12 having a thickness of about 50 nm.

As a material for the polymeric light emitting layer 22, a polymer represented by the following chemical formula (P1) was employed and deposited by an ink jet method to form the polymeric light emitting layer 22 having a thickness of about 40 nm.

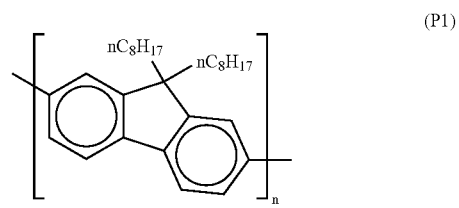

(P1)

wherein n is an integer representing the polymerization degree thereof.

An $MgF_2$ buffer layer having a thickness of about 10 nm was deposited over the polymeric light emitting layer 22, and then, a counter electrode (silver electrode) 23 having a thickness of about 200 nm was deposited thereon. Finally, a sealing film 20 was formed on the top surface of the resultant structure, thus sealing every pixels.

The EL display device thus obtained was subjected to a continuously actuation for ten thousand hours while applying a voltage of 15V thereto. As a result, the luminance thereof after this experiment was found about 80% relative to the initial value of luminance. Further, the number of the pixels which ceased to emit was generated at a ratio of less than 10 per 10,000 of pixels.

EXAMPLE 6

The toluene solution of Example 5 was coated on the surface of a substrate by spin-coating method to form a coated film, to which ultraviolet rays 30 $mJ/cm^2$ in exposure dose was irradiated in a pattern through a mask. The film thus irradiated was immersed in xylene for about one minute and shaken to perform the development thereof. As a result, it was possible to form a hole transferring layer only on the region of pixels.

Further, following the same procedures as illustrated in Example 5, an organic EL display device was manufactured. The EL display device thus obtained was subjected to a continuously actuation for ten thousand hours while applying a voltage of 15V thereto. As a result, the luminance thereof after this experiment was found about 85% relative to the initial value of luminance. Further, the number of the pixels which ceased to emit was generated at a ratio of less than 10 per 10,000 of pixels. It was confirmed through this example that it was possible to perform the patterning of the hole transferring layer by using photolithography without necessitating the employment of an ink jet method.

EXAMPLE 7

After the hole transferring layer was formed as described in Example 6, a light emitting layer was formed as follows. Namely, the compound represented by the aforementioned chemical formula (P2) was allowed to react with cinnamaldehyde to synthesize a polymer. The polymer thus obtained was then dissolved in toluene to obtain a toluene solution, which was then coated on the hole transferring layer. Against this coated film, ultraviolet rays 30 $mJ/cm^2$ in exposure dose was irradiated in a pattern through a mask. The film thus irradiated was immersed in xylene for about one minute and shaken to perform the development thereof. As a result, it was possible to form a hole transferring layer only on the region of pixels.

Further, following the same procedures as illustrated in Example 5, an organic EL display device was manufactured.

The EL display device thus obtained was subjected to a continuously actuation for ten thousand hours while applying a voltage of 15V thereto. As a result, the luminance thereof after this experiment was found about 85% relative to the initial value of luminance. Further, the number of the pixels which ceased to emit was generated at a ratio of less than 10 per 10,000 of pixels. It was confirmed through this example that it was possible to perform the patterning of the hole transferring layer and of the light emitting layer by using photolithography without necessitating the employment of an ink jet method.

To realize the ink jet method, the materials employed therein would be restricted in order to make the materials satisfy the conditions related to the control of physical properties of the ink employed therein. Therefore, the fact that the organic EL display device can be manufactured by a process without necessitating the employment of the ink jet method would lead to expansion of freedom in selecting materials to be employed therein.

EXAMPLE 8

A compound represented by the aforementioned chemical formula (8) was allowed to react with cinnamaldehyde to synthesize a polymer. The polymer thus obtained was then dissolved in toluene to obtain a toluene solution, which was then employed to form the hole transferring layer 12, thereby manufacturing an organic EL display device as shown in FIG. 2.

More specifically, following the same procedures as illustrated in Example 5 except that the material for forming the hole transferring layer 12 was changed to the aforementioned toluene solution and that a phosphorescent polymer represented by the following chemical formula (13) was employed for the formation of the polymeric light emitting layer 22, an organic EL display device was manufactured.

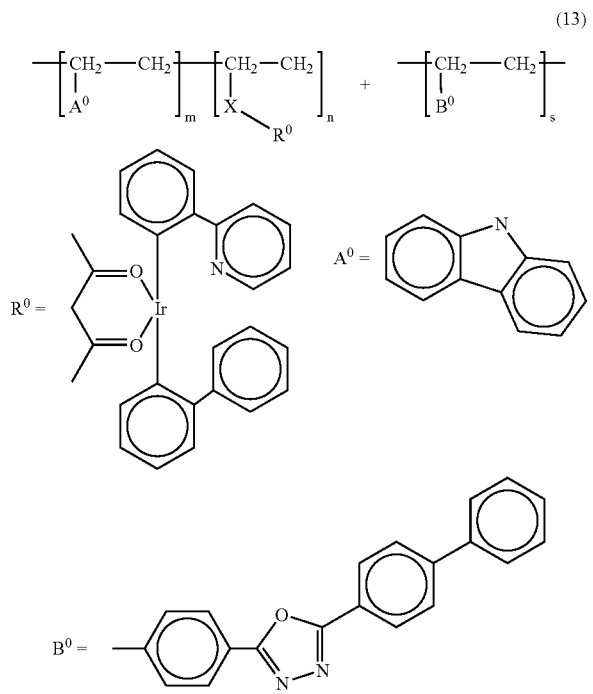

wherein m, n and s are respectively an integer of one or more.

In the same manner as in Example 5, the EL display device thus obtained was subjected to a continuously actuation for ten thousand hours. As a result, the luminance thereof after this experiment was found about 80% relative to the initial value of luminance. Further, the number of the pixels which ceased to emit was generated at a ratio of less than 10 per 10,000 of pixels. Furthermore, the take-out efficiency of luminescence was 4.5%.

It was confirmed through the results of this example that it was possible to enhance not only the take-out efficiency of luminescence but also the life of the organic EL display device by manufacturing it using, as a material for the hole transferring layer, a polymer obtained through the polymerization of a compound represented by the aforementioned chemical formula (8) and also using, as a material for the polymeric light emitting layer, a phosphorescent polymer.

EXAMPLE 9

By using a compound represented by the aforementioned chemical formula (13) and in the same manner as described in Example 8, a light emitting layer was formed on the surface of the hole transferring layer that had been manufactured in Example 6. Further, in the same procedures as described in Example 5, an organic EL display device was manufactured.

The EL display device thus obtained was subjected to a continuously actuation for ten thousand hours while applying a voltage of 15V thereto. As a result, the luminance thereof after this experiment was found about 85% relative to the initial value of luminance. Further, the number of the pixels which ceased to emit was generated at a ratio of less than 10 per 10,000 of pixels. Furthermore, the take-out efficiency of luminescence was 4.6%.

As already explained above, in spite of the advantage that the luminescence efficiency of the organic EL display device can be prominently enhanced, the phosphorescent material has been conventionally considered as being vulnerable to deterioration due to water originating from PEDOP/PSS constituting the hole transferring layer, thereby making it difficult to prolong the life of the organic EL display device when the phosphorescent material is employed therein. Whereas according to this example, it was made possible to enhance not only the light emitting efficiency but also the life of the organic EL display device.

EXAMPLE 10

2% by weight of a complex of rare earth element represented by the following chemical formula ($P_{rc}$) and 98% by weight (weight ratio of only solid matter) of methyl methacrylate (PMMA) monomer were dissolved in tetrahydrofuran to prepare a tetrahydrofuran solution.

The solution thus obtained was applied to the surface of the hole transferring layer of Example 6 by an ink jet method to form a film. This film was then heated at a temperature of 120° C. for 10 minutes to polymerize the film, thus forming a layer of PMMA having the rare earth element dispersed therein uniformly.

Further, in the same procedures as described in Example 5, an organic EL display device was manufactured. The EL display device thus obtained was subjected to a continuously actuation for ten thousand hours while applying a voltage of 15V thereto. As a result, the luminance thereof after this experiment was found about 85% relative to the initial value of luminance. Further, the number of the pixels which ceased to emit was generated at a ratio of less than 10 per 10,000 of pixels.

Although the complex of rare earth element may be deteriorated due to the presence of water, since the organic EL display device according to this example was manufactured in a non-aqueous process, it was confirmed possible to prolong the life of the organic EL display device.

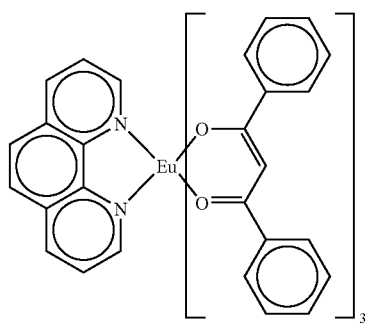

(P rc)

EXAMPLE 11

The same procedures as explained in Example 1 were repeated except that as a material for the hole transferring layer, a compound represented by the aforementioned chemical formula (14) was substituted for the compound employed in Example 1 as a material for the hole transferring layer, thereby manufacturing a low molecular type organic EL display device as shown in FIG. 1.

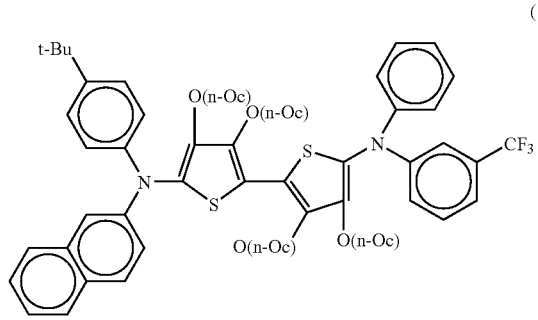

(14)

The compound represented by the aforementioned chemical formula (14) was synthesized by the same procedures as described above except that a triaryl amine having $CF_3$ group and t-Bu group was employed.

The EL display device thus obtained was subjected to a continuously actuation for ten thousand hours while applying a voltage of 15V thereto. As a result, the deterioration in luminance thereof was confined within 10%, and any pixel which ceased to emit any longer was not recognized at all. The reason for the decrease in deterioration of luminescence as compared with Example 1 may be assumably attributed to the fact that owing to the introduction therein of trifluoromethyl group, the amorphousness of the hole transferring layer became further enhanced.

EXAMPLE 12

The same procedures as explained in Example 1 were repeated except that as a material for the hole transferring layer, a compound represented by the aforementioned chemical formula (15) was substituted for the compound employed in Example 1 as a material for the hole transferring layer, thereby manufacturing a low molecular type organic EL display device as shown in FIG. 1.

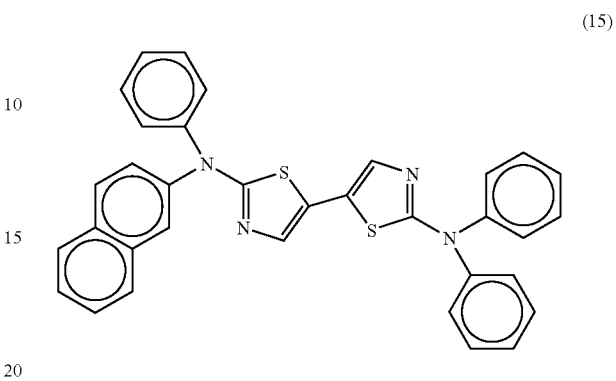

(15)

The compound represented by the aforementioned chemical formula (15) was synthesized by the same procedures as described above except that 1,3-thiazole dihalide polymer was substituted for thiophene dihalide polymer.

The EL display device thus obtained was subjected to a continuously actuation for ten thousand hours while applying a voltage of 15V thereto. As a result, the deterioration in luminance thereof was confined within 15%, and any pixel which ceased to emit any longer was not recognized at all.

Comparative Example 2

The same procedures as explained in Example 5 were repeated except that as a material for the hole transferring layer, an aqueous dispersion of PEDOP•PSS represented by the aforementioned chemical formula (7) was employed, thereby manufacturing an organic EL display device as shown in FIG. 2.

The EL display device thus obtained was subjected to a continuously actuation for ten thousand hours in the same manner as conducted in Example 5. As a result, the luminance thereof after this experiment was found about 30% relative to the initial value of luminance. Further, the number of the pixels which ceased to emit was generated at a ratio of 300 or more per 10,000 of pixels.

Comparative Example 3

The same procedures as explained in Example 6 were repeated except that as a material for the hole transferring layer, an aqueous dispersion of PEDOP•PSS represented by the aforementioned chemical formula (7) was employed, thereby manufacturing an organic EL display device as shown in FIG. 2.

The EL display device thus obtained was subjected to a continuously actuation for ten thousand hours in the same manner as conducted in Example 5. As a result, the luminance thereof after this experiment was found about 30% relative to the initial value of luminance. Further, the number of the pixels which ceased to emit was generated at a ratio of 300 or more per 10,000 of pixels. Furthermore, the take-out efficiency of luminescence was 1.5%.

The reasons for these results may be assumably attributed to the fact that not only due to the generation of quenching of triplet excited state by the effect of oxygen but also due to the employment of PEDOP•PSS for the formation of the hole transferring layer, the deterioration with time of the polymer of phosphorescent emitting layer was caused to occur under the influence of water.

As explained above, it is possible, according to the present invention, to provide an organic EL display device which is long in useful life, excellent in reliability, and sufficiently high in light emitting efficiency.

The present invention is applicable not only to a low molecular type organic EL display device but also to a high molecular type organic EL display device, and hence the present invention would be very valuable in industrial viewpoints.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An organic electro-luminescent display device, comprising:
   a transparent electrode;
   a counter electrode spaced away from said transparent electrode;
   a light emitting layer comprising a phosphorescent compound and interposed between said transparent electrode and said counter electrode; and
   a hole transferring layer interposed between said transparent electrode and said light emitting layer, said hole transferring layer comprising triaryl amine compound represented by the following general formula (1):

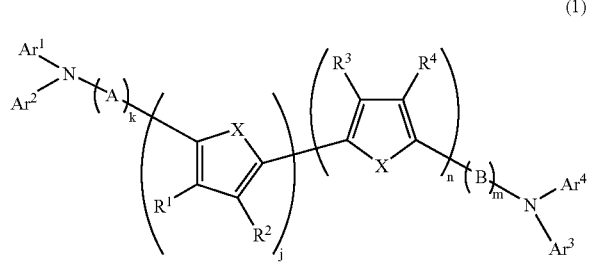

(1)

wherein $Ar^1$, $Ar^2$, $Ar^3$ and $Ar^4$ are individually substituted or unsubstituted aryl group or aromatic heterocyclic group with proviso that a situation where a combination of groups ($Ar^1$, $Ar^2$) is identical with a combination of groups ($Ar^3$, $Ar^4$) is excluded; A and B may be the same with or different from each other and are individually substituted or unsubstituted aryl group or aromatic heterocyclic group; k and m are respectively an integer; X is a heteroatom; j is an integer of 1 or more; n is an integer of 1 or more; $R^1$, $R^2$, $R^3$ and $R^4$ may be the same with or different from each other and are individually hydrogen atom, straight or branched substituted or unsubstituted alkyl group, alkoxy group or aryl group wherein the alkyl groups or alkoxy groups which are bonded to neighboring carbon atom may be connected together to form a closed ring.

2. The organic electro-luminescent display device according to claim 1, wherein said triaryl amine compound included in said hole transferring layer comprises a compound represented by said general formula (1) wherein sulfur atom is introduced therein as said heteroatom X.

3. The organic electro-luminescent display device according to claim 2, wherein said triaryl amine compound included in said hole transferring layer comprises a compound represented by said general formula (1) wherein k and m is respectively zero (k=M=0).

4. The organic electro-luminescent display device according to claim 1, wherein said phosphorescent compound comprises an iridium complex.

5. The organic electro-luminescent display device according to claim 1, wherein said triaryl amine compound included in said hole transferring layer is constituted by a compound represented by said general formula (1) wherein at least one of ($A^1$, $Ar^2$) contains fluorine atom, and none of ($Ar^3$, $Ar^4$) include fluorine atom, or constituted by a compound represented by said general formula (1) wherein at least one of ($Ar^3$, $Ar^4$) contains fluorine atom, and none of ($A^1$, $Ar^2$) contain fluorine atom.

6. A method of manufacturing the organic electro-luminescent display device according to claim 1, said method comprising:
   forming a transparent electrode on a substrate;
   forming a hole transferring layer on said transparent electrode, said hole transferring layer comprising triaryl amine compound represented by the following general formula (1);
   forming a light emitting layer on said hole transferring layer; and
   forming a counter electrode above said light emitting layer;
   wherein at least one of said hole transferring layer and said light emitting layer is patterned by photolithography;

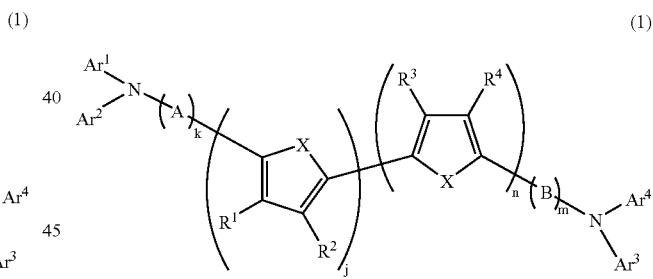

(1)

wherein $Ar^1$, $Ar^2$, $Ar^3$ and $Ar^4$ are individually substituted or unsubstituted aryl group or aromatic heterocyclic group with proviso that a situation where a combination of groups ($Ar^1$, $Ar^2$) is identical with a combination of groups ($Ar^3$, $Ar^4$) is excluded; A and B may be the same with or different from each other and are individually substituted or unsubstituted aryl group or aromatic heterocyclic group; k and m are respectively an integer; X is a heteroatom; j is an integer of 1 or more; n is an integer of 1 or more; $R^1$, $R^2$, $R^3$ and $R^4$ may be the same with or different from each other and are individually hydrogen atom, straight or branched substituted or unsubstituted alkyl group, alkoxy group or aryl group wherein the alkyl groups or alkoxy groups which are bonded to neighboring carbon atom may be connected together to form a closed ring.

7. The organic electro-luminescent display device according to claim 1, wherein in the general formula (1), at least one of $Ar^1$, $Ar^2$, $Ar^3$, and $Ar^4$ is a condensed ring.

8. The organic electro-luminescent display device according to claim 7, wherein the condensed ring is naphthyl group.

9. The organic electro-luminescent display device according to claim 1, wherein in the general formula (1):
at least one of Ar¹ and Ar² is a condensed ring, and
Ar³ and Ar⁴ are non-condensed rings.

10. The organic electro-luminescent display device according to claim 9, wherein the condensed ring is naphthyl group.

11. An organic electro-luminescent display device, comprising:
a transparent electrode;
a counter electrode spaced away from said transparent electrode;
a light emitting layer comprising a phosphorescent compound and interposed between said transparent electrode and said counter electrode; and
a hole transferring layer interposed between said transparent electrode and said light emitting layer, said hole transferring layer comprising triaryl amine compound represented by the following general formula (3):

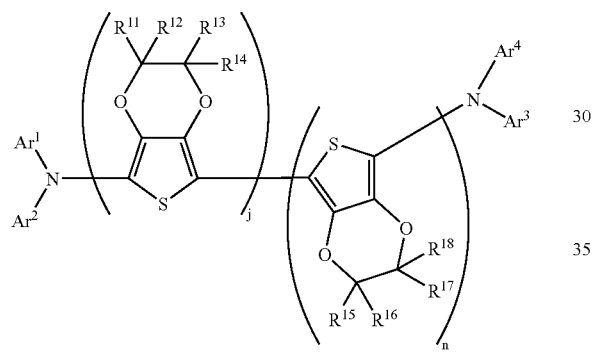

(3)

wherein Ar¹, Ar², Ar³ and Ar⁴ may be the same with or different from each other and are individually substituted or unsubstituted aryl group or aromatic heterocyclic group with proviso that a situation where a combination of groups (Ar¹, Ar²) is identical with a combination of groups (Ar³, Ar⁴) is excluded; $R^{11}$, $R^{12}$, $R^{13}$, $R^{14}$, $R^{15}$, $R^{16}$, $R^{17}$ and $R^{18}$ may be with or different from each other and are individually hydrogen atom, straight or branched substituted or unsubstituted alkyl group, alkoxy group or aryl group; j is an integer of 1 or more; and n is an integer of 1 or more.

12. The organic electro-luminescent display device according to claim 11, wherein said phosphorescent compound comprises an iridium complex.

13. The organic electro-luminescent display device according to claim 11, wherein said triaryl amine compound included in said hole transferring layer is constituted by a compound represented by said general formula (3) wherein at least one of (Ar², Ar¹³) contains fluorine atom, and none of (Ar¹¹, biphenyl) include fluorine atom, or constituted by a compound represented by said general formula (3) wherein at least one of (Ar¹¹, biphenyl) contains fluorine atom, and none of (Ar¹², Ar¹³) contain fluorine atom.

14. A method of manufacturing the organic electro-luminescent display device according to claim 11, said method comprising:
forming a transparent electrode on a substrate;

forming a hole transferring layer on said transparent electrode, said hole transferring layer comprising triaryl amine compound represented by the following general formula (3);
forming a light emitting layer on said hole transferring layer; and
forming a counter electrode above said light emitting layer;
wherein at least one of said hole transferring layer and said light emitting layer is patterned by photolithography;

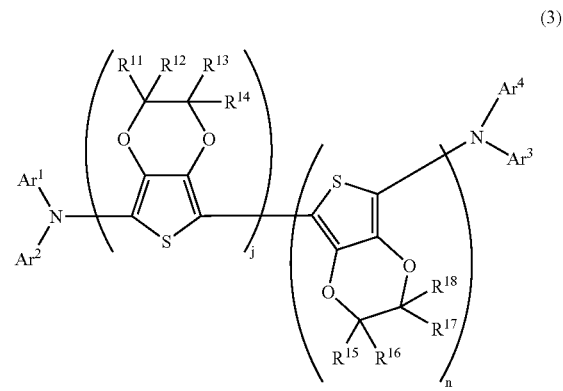

(3)

wherein Ar¹, Ar², Ar³ and Ar⁴ may be the same with or different from each other and are individually substituted or unsubstituted aryl group or aromatic heterocyclic group with proviso that a situation where a combination of groups (Ar¹, Ar²) is identical with a combination of groups (Ar³, Ar⁴) is excluded; $R^{11}$, $R^{12}$, $R^{13}$, $R^{14}$, $R^{15}$, $R^{16}$, $R^{17}$ and $R^{18}$ may be the same with or different from each other and are individually hydrogen atom, straight or branched substituted or unsubstituted alkyl group, alkoxy group or aryl group; j is an integer of 1 or more; and n is an integer of 1 or more.

15. The organic electro-luminescent display device according to claim 11, wherein in the general formula (1), at least one of Ar¹, Ar², Ar³, and Ar⁴ is a condensed ring.

16. The organic electro-luminescent display device according to claim 15, wherein the condensed ring is naphthyl group.

17. The organic electro-luminescent display device according to claim 11, wherein in the general formula (1):
at least one of Ar¹ and Ar² is a condensed ring, and
Ar³ and Ar⁴ are non-condensed rings.

18. The organic electro-luminescent display device according to claim 17, wherein the condensed ring is naphthyl group.

19. An organic electro-luminescent display device, comprising:
a transparent electrode;
a counter electrode spaced away from said transparent electrode;
a light emitting layer comprising a phosphorescent compound and interposed between said transparent electrode and said counter electrode; and
a hole transferring layer interposed between said transparent electrode and said light emitting layer, said hole transferring layer comprising triaryl amine compound represented by the following general formula (5):

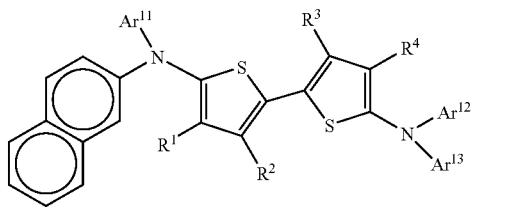

wherein Ar$^{11}$ is substituted or unsubstituted phenyl group, naphthyl group, tetrahydronaphthyl group or heterocyclic group constituted by a single ring; Ar$^{12}$ and Ar$^{13}$ may be the same with or different from each other and are individually substituted or unsubstituted phenyl group or heterocyclic group constituted by a single ring; and R$^1$, R$^2$, R$^3$ and R$^4$ may be the same with or different from each other and are individually hydrogen atom, straight or branched substituted or unsubstituted alkyl group, alkoxy group or aryl group wherein the alkyl groups or alkoxy groups which are bonded to neighboring carbon atom may be connected together to form a closed ring.

20. The organic electro-luminescent display device according to claim 19, wherein said triaryl amine compound included in said hole transferring layer is constituted by a compound represented by said general formula (5) wherein at least one of (Ar$^{12}$, Ar$^{13}$) contains fluorine atom, and none of (Ar$^{11}$, biphenyl) include fluorine atom, or constituted by a compound represented by said general formula (5) wherein at least one of (Ar$^{11}$, biphenyl) contains fluorine atom, and none of (Ar$^{12}$, Ar$^{13}$) contain fluorine atom.

21. The organic electro-luminescent display device according to claim 19, wherein said phosphorescent compound comprises an iridium complex.

22. A method of manufacturing the organic electro-luminescent display device according to claim 19, said method comprising:
    forming a transparent electrode on a substrate;
    forming a hole transferring layer on said transparent electrode, said hole transferring layer comprising triaryl amine compound represented by the following general formula (5);
    forming a light emitting layer on said hole transferring layer; and
    forming a counter electrode above said light emitting layer;
    wherein at least one of said hole transferring layer and said light emitting layer is patterned by photolithography;

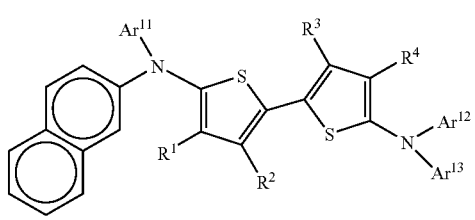

wherein Ar$^{11}$ is substituted or unsubstituted phenyl group, naphthyl group, tetrahydronaphthyl group or heterocyclic group constituted by a single ring; Ar$^{12}$ and Ar$^{13}$ may be the same with or different from each other and are individually substituted or unsubstituted phenyl group or heterocyclic group constituted by a single ring; and R$^1$, R$^2$, R$^3$ and R$^4$ may be the same with or different from each other and are individually hydrogen atom, straight or branched substituted or unsubstituted alkyl group, alkoxy group or aryl group wherein the alkyl groups or alkoxy groups which are bonded to neighboring carbon atom may be connected together to form a closed ring.

23. An organic electro-luminescent display device, comprising:
    a transparent electrode;
    a counter electrode spaced away from said transparent electrode;
    a light emitting layer comprising a phosphorescent compound and interposed between said transparent electrode and said counter electrode; and
    a hole transferring layer interposed between said transparent electrode and said light emitting layer, said hole transferring layer comprising triaryl amine compound represented by the following general formula (6):

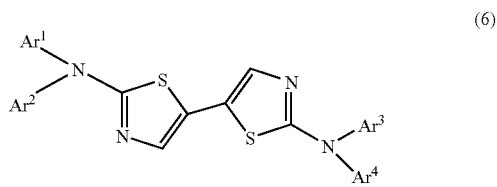

wherein Ar$^1$, Ar$^2$, Ar$^3$ and Ar$^4$ are individually substituted or unsubstituted aryl group or aromatic heterocyclic group with proviso that a situation where a combination of groups (Ar$^1$, Ar$^2$) is identical with a combination of groups (Ar$^3$, Ar$^4$) is excluded.

24. The organic electro-luminescent display device according to claim 23, wherein said phosphorescent compound comprises an iridium complex.

25. The organic electro-luminescent display device according to claim 23, wherein said triaryl amine compound included in said hole transferring layer is constituted by a compound represented by said general formula (6) wherein at least one of (Ar$^1$, Ar$^2$) contains fluorine atom, and none of (Ar$^3$, Ar$^4$) include fluorine atom, or constituted by a compound represented by said general formula (6) wherein at least one of (Ar$^3$, Ar$^4$) contains fluorine atom, and none of (Ar$^1$, Ar$^2$) contain fluorine atom.

26. A method of manufacturing the organic electro-luminescent display device according to claim 23, said method comprising:
    forming a transparent electrode on a substrate;
    forming a hole transferring layer on said transparent electrode, said hole transferring layer comprising triaryl amine compound represented by the following general formula (6);
    forming a light emitting layer on said hole transferring layer; and
    forming a counter electrode above said light emitting layer;
    wherein at least one of said hole transferring layer and said light emitting layer is patterned by photolithography;

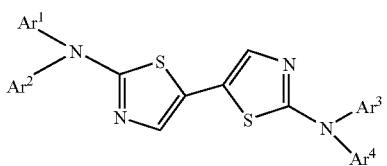

(6)

wherein $Ar^1$, $Ar^2$, $Ar^3$ and $Ar^4$ are individually substituted or unsubstituted aryl group or aromatic heterocyclic group with proviso that a situation where a combination of groups ($Ar^1$, $Ar^2$) is identical with a combination of groups ($Ar^3$, $Ar^4$) is excluded.

27. The organic electro-luminescent display device according to claim 23, wherein in the general formula (1), at least one of $Ar^1$, $Ar^2$, $Ar^3$, and $Ar^4$ is a condensed ring.

28. The organic electro-luminescent display device according to claim 27, wherein the condensed ring is naphthyl group.

29. The organic electro-luminescent display device according to claim 23, wherein in the general formula (1):
at least one of $Ar^1$ and $Ar^2$ is a condensed ring, and
$Ar^3$ and $Ar^4$ are non-condensed rings.

30. The organic electro-luminescent display device according to claim 29, wherein the condensed ring is naphthyl group.

* * * * *